(12) United States Patent
Tian (10) Patent No.: US 10,804,302 B2
(45) Date of Patent: Oct. 13, 2020

(54) PIXEL STRUCTURE AND MANUFACTURING METHOD THEREFOR

(71) Applicant: Shanghai Huali Microelectronics Corporation, Shanghai (CN)

(72) Inventor: Zhi Tian, Shanghai (CN)

(*) Notice: Subject to any disclaimer, the term of this patent is extended or adjusted under 35 U.S.C. 154(b) by 139 days.

(21) Appl. No.: 16/203,628

(22) Filed: Nov. 29, 2018

(65) Prior Publication Data

US 2020/0075647 A1 Mar. 5, 2020

(30) Foreign Application Priority Data

Aug. 31, 2018 (CN) .......................... 2018 1 1013688

(51) Int. Cl.
*H01L 27/146* (2006.01)

(52) U.S. Cl.
CPC .. *H01L 27/14612* (2013.01); *H01L 27/14603* (2013.01); *H01L 27/14643* (2013.01); *H01L 27/14689* (2013.01)

(58) Field of Classification Search
CPC ......... H01L 27/14601; H01L 27/14603; H01L 27/14612; H01L 27/14641; H01L 27/14643; H01L 27/1463; H01L 27/14689
See application file for complete search history.

(56) References Cited

U.S. PATENT DOCUMENTS

| | | | |
|---|---|---|---|
| 7,692,226 B2* | 4/2010 | Lee | H01L 27/14603 257/204 |
| 2010/0225793 A1* | 9/2010 | Matsuda | H01L 27/14806 348/280 |
| 2011/0073923 A1* | 3/2011 | Tatani | H01L 27/1463 257/291 |
| 2015/0130902 A1* | 5/2015 | Fossum | G01S 7/4914 348/46 |

* cited by examiner

*Primary Examiner* — David C Spalla
(74) *Attorney, Agent, or Firm* — Kilpatrick Townsend & Stockton, LLP (57) ABSTRACT

The present disclosure provides a pixel structure for a CMOS image sensor and a manufacturing method therefor, the pixel structure comprising a photo diode and a source follow transistor, and an isolation strip is provided between the photo diode and the source follow transistor, and a contact hole is provided in a drain terminal of the source follow transistor, with the width of a part, corresponding to the contact hole portion, of a drain terminal active area of the source follow transistor being smaller than the width of the rest of the drain terminal active area, so that the width of a part, corresponding to the contact hole portion, of the isolation strip is greater than the width of a part, corresponding to the rest of the drain terminal active area, of the isolation strip.

17 Claims, 5 Drawing Sheets

PIXEL STRUCTURE AND MANUFACTURING METHOD THEREFOR

CROSS-REFERENCES TO RELATED APPLICATIONS

The present application claims priority to Chinese Patent Application No. 201811013688.1, filed on Aug. 31, 2018, entitled "PIXEL STRUCTURE AND MANUFACTURING METHOD THEREFOR", which is incorporated by reference herein for all purposes.

FIELD

The present disclosure relates to the field of semiconductors, and particularly to the field of CMOS image sensors.

BACKGROUND OF THE DISCLOSURE

The use of a CMOS image sensor (CIS) has increased year by year since its manufacturing process is compatible with the existing integrated circuit manufacturing process, and its performance has many advantages compared with the original charge coupled device (CCD). The CMOS image sensor can integrate a driver circuit and a pixel together, so that since the CMOS image sensor can acquire an electrical signal while collecting an optical signal, it can process image information in real time, then it is much faster than the CCD image sensor. The CMOS image sensor also has many advantages, such as a low price, a large bandwidth, blur preventing, access flexibility and a large filling coefficient.

Figure 1:
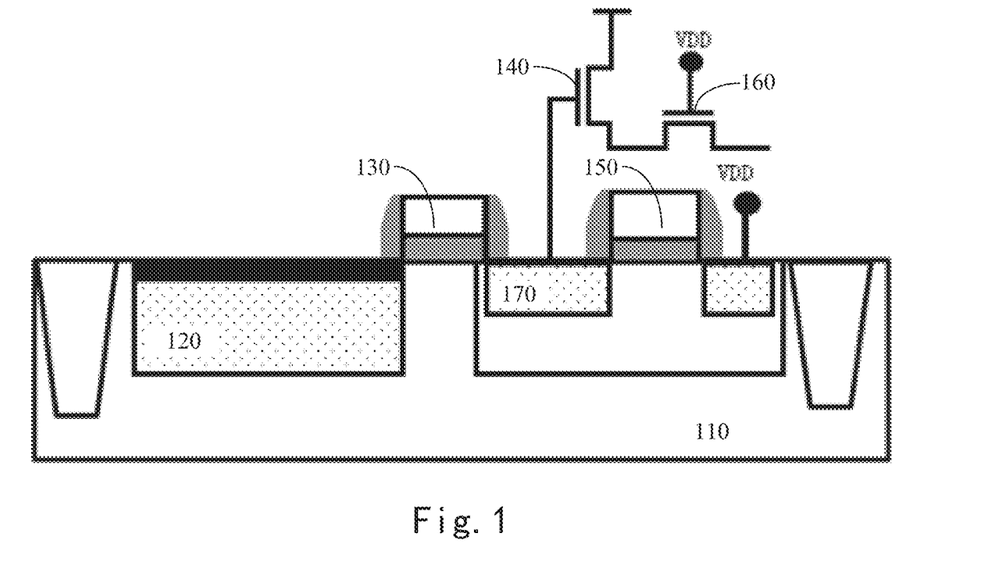
FIG. 1 shows a schematic diagram of a 4T-structure CMOS image sensor.

Generally, an active pixel unit of the CMOS image sensor includes a P+/N+/P− photo diode 120 (PD) and several transistors in a P-type epitaxial layer 110. Taking a 4T-structure CMOS image sensor as an example, four transistors specifically include a transfer transistor 130 (TX), a source follow transistor 140 (SF), a reset transistor 150 (RST), and a row select transistor 160 (RS). FIG. 1 shows a schematic diagram of a 4T-structure CMOS image sensor.

The basic working principle of the CMOS image sensor as shown in FIG. 1 is as follows: before illumination, turning on the reset transistor 150 and the transfer transistor 130 to release existing electrons in the photo diode 120 region; during illumination, turning off all the transistors to generate charges in a space charge region of the photo diode 120; and during reading, turning on the transfer transistor 130 to transmit the charges stored in the PD region to a floating diffusion node 170 (FD), and after the transmission, turning off the transfer transistor, and waiting for the entering of subsequent illumination. A charge signal on the floating diffusion node 170 is then used to adjust the source follow transistor 140, convert charges to a voltage, and output current to an analogue-to-digital conversion circuit via the row select transistor 160. Due to the large dimension of the photo diode 120, the full well capacity (the capability of the photo diode to store charges) is improved, and more electrons can be stored, so that a dynamic range (the ratio of the brightest condition to the darkest condition) of the pixel unit can be improved, and the effect of noises on the pixel can be reduced, and the signal to noise ratio will be improved.

As the requirements for high pixels increase, the area of transistors in a pixel region as well as the distance of isolation are both to be reduced, wherein the performance of a device itself may also affect the overall performance of the pixel structure.

Figure 2:
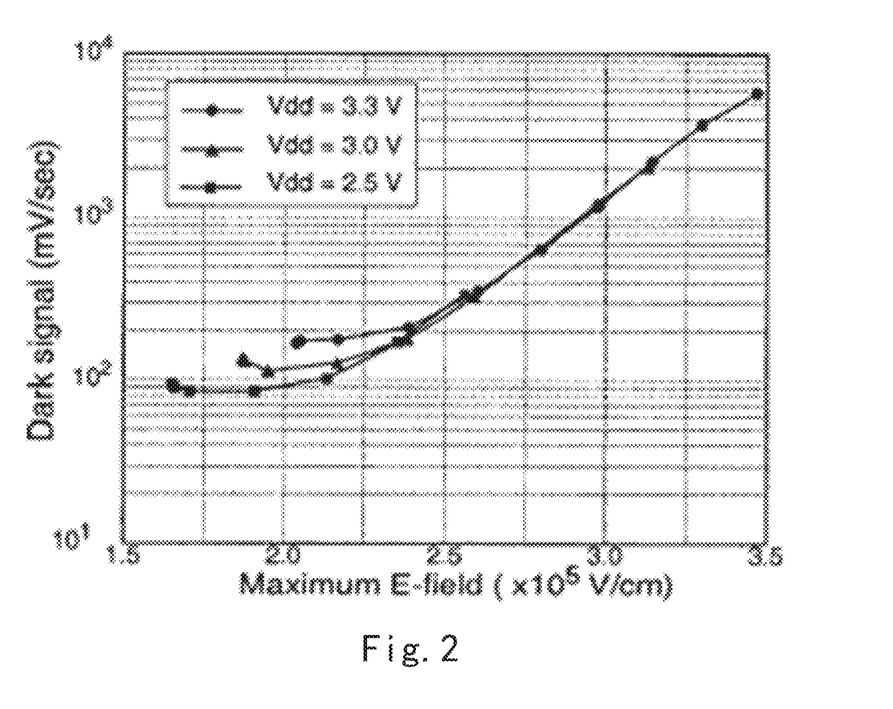
FIG. 2 shows the relationship between dark current in the CMOS image sensor and the Vdd voltage of a source follow transistor.

In particular, minority carriers resulted from a thermal electron effect (which will occur in the condition of an electric field>3E+5V/cm) of the source follow transistor (SF) will diffuse to nearby pixel units, causing an increase in dark current in the pixel. FIG. 2 shows experimental results from Ching-Chun Wang et al. ("The Effect of Hot Carriers on the Operation of CMOS Active Pixel Sensors" Ching-Chun Wang, 0-7803-7050-3/01/$10.00 02001 IEEE, 563-566). In the figure, the horizontal axis represents the maximum electric field strength, and the vertical axis represents the dark current signal, and it can be seen from FIG. 2 that as the Vdd voltage of the source follow transistor (SF) increases, the dark current gradually increases, thereby affecting the performance of the pixel unit. Moreover, the generated minority carriers reduce the threshold voltage of the source follow transistor (SF), which will further exacerbate the thermal electron effect. This positive feedback will cause the performance of the nearby pixel units to degrade gradually as the dimension of the transistor scales down.

Therefore, there is an urgent need for a pixel structure, which is capable of reducing dark current resulted from a dimension reduction of a pixel region while the dimension of the pixel region satisfies the requirements of high pixels, thereby improving the performance of the pixel unit.

BRIEF SUMMARY OF THE DISCLOSURE

A brief summary on one or more embodiments is given below to provide the basic understanding for these embodiments. This summary is not an exhaustive overview of all the contemplated embodiments and is neither intended to indicate critical or decisive elements of all embodiments nor to attempt to define the scope of any or all embodiments. Its sole purpose is to present some concepts of one or more embodiments in a simplified form as a preface for a more detailed description presented later.

As described above, in order to reduce dark current resulted from the reduction of the dimension of a pixel unit, the present disclosure provides a pixel structure for a CMOS image sensor, the pixel structure comprising a photo diode and a source follow transistor, wherein an isolation strip is provided between the photo diode and the source follow transistor, and a contact hole is provided in a drain terminal of the source follow transistor, with the width of a part, corresponding to the contact hole portion, of a drain terminal active area of the source follow transistor being smaller than the width of the rest of the drain terminal active area, so that the width of a part, corresponding to the contact hole portion, of the isolation strip is greater than the width of a part, corresponding to the rest of the drain terminal active area, of the isolation strip.

In the pixel structure as described above, In one embodiment, the drain terminal active area is of an hourglass shape.

In the pixel structure as described above, In one embodiment, the drain terminal active area is of an H-shape.

In the pixel structure as described above, In one embodiment, the width of the part, corresponding to the contact hole portion, of the drain terminal active area is in a range of 0.12-0.18 um, and the width of the rest of the drain terminal active area is in a range of 0.16-0.4 um.

In the pixel structure as described above, in one embodiment, the width of the rest of the drain terminal active area is 0.22 um.

In the pixel structure as described above, In one embodiment, the width of the part, corresponding to the contact hole portion, of the isolation strip is in a range of 0.13-0.16 um, and the width of the part, corresponding to the rest of the drain terminal active area, of the isolation strip is in a range of 0.11-0.14 um.

In the pixel structure as described above, In one embodiment, the width of the part, corresponding to the rest of the drain terminal active area, of the isolation strip is 0.11 um.

In the pixel structure as described above, In one embodiment, the distance between the contact hole and the boundary of the drain terminal active area is in a range of 0.015-0.045 um.

The pixel structure as described above, In one embodiment, further comprises a reset transistor, wherein the drain terminal active area is between the gate of the reset transistor and the gate of the source follow transistor, and the length of the rest of the drain terminal active area is in a range of 0.2-0.4 um.

In the pixel structure as described above, In one embodiment, the length of the rest of the drain terminal active area is 0.2 um.

The pixel structure as described above, In one embodiment, further comprises a row select transistor and a transfer transistor, wherein the width of a device active area of each of the reset transistor, the row select transistor, and the transfer transistor is consistent with the width of the rest of the drain terminal active area.

In the pixel structure as described above, In one embodiment, the isolation strip comprises a shallow trench isolation.

The present disclosure further provides a CMOS image sensor comprising any one of the above pixel structures.

The present disclosure further provides a manufacturing method for a pixel structure, wherein the pixel structure is used for a CMOS image sensor, the manufacturing method comprising: providing a substrate; forming an isolation strip in the substrate to define an active area of a photo diode and an active area of a source follow transistor of the pixel structure separated by the isolation strip; and forming the photo diode and the source follow transistor on the active areas, wherein the width of a part, corresponding to a contact hole portion in a drain terminal active area of the source follow transistor, of the isolation strip is greater than the width of a part, corresponding to the rest of the drain terminal active area of the source follow transistor, of the isolation strip, so that the width of a part, corresponding to the contact hole portion, of the drain terminal active area of the source follow transistor is smaller than the width of the rest of the drain terminal active area of the source follow transistor.

In the manufacturing method as described above, In one embodiment, the isolation strip is formed to define the drain terminal active area of the source follow transistor to be of an hourglass shape.

In the manufacturing method as described above, In one embodiment, the isolation strip is formed to define the drain terminal active area of the source follow transistor to be of an H-shape.

In the manufacturing method as described above, In one embodiment, the isolation strip is formed by means of a shallow trench isolation process.

In the pixel structure manufactured according to the manufacturing method provided in the present disclosure, by searching for reasons from the source which generates the dark current, the width of the part, corresponding to the contact hole portion, of the drain terminal active area of the source follow transistor is reduced and the width of the part, corresponding to the contact hole portion, of the isolation strip, is increased. Since the contact hole in the drain terminal active area is used to access the Vdd voltage of the source follow transistor, that is, it is a source which generates the thermal electron effect in the source follow transistor, in the case of the reduction of the dimension of the transistor of the pixel structure, by reducing the width of the part, corresponding to the contact hole portion, of the drain terminal active area, the width of the part, corresponding to the contact hole portion, of the isolation strip is increased, and the effect of isolating minority carriers is improved, thereby reducing the generation of dark current.

REFERENCE NUMERALS

110 P-type epitaxial layer
120 Photo diode
130 Transfer transistor
140 Source follow transistor
150 Reset transistor
160 Row select transistor
170 Floating diffusion node
300 Source follow transistor
310 Pinch-off point
400, 500, 600 Transistor active area
410, 510, 610 Pixel region active area
401, 501, 601 Drain terminal active area
411, 511, 611 Pixel region gate zone
420, 520, 620 Gate of source follow transistor
430, 530, 630 Gate of reset transistor
440, 540, 640 Gate of row select transistor
450, 451, 550, 551, 650, 651 Isolation strip

DETAILED DESCRIPTION OF THE DISCLOSURE

The present disclosure relates to a semiconductor process and device. One embodiment of the present disclosure provides a pixel structure for CMOS image sensor, wherein the width of a part, corresponding to a contact hole portion, of a drain terminal active area of a source follow transistor of the pixel structure is smaller than the width of the rest of the active area, so that the width of a part, corresponding to the contact hole portion, of an isolation strip between the source follow transistor and a photo diode is greater than the width of the rest of the isolation strip. The present disclosure also provides other embodiments.

The reader is cautioned as to all files and documents which are filed at the same time as this specification and which are open for the public to consult, and the contents of all such files and documents are incorporated herein by reference. Unless directly stated otherwise, all features disclosed in this specification (including any appended claims, the abstract, and the accompanying drawings) may be replaced by alternative features serving the same, equivalent, or similar purpose. Therefore, unless expressly stated otherwise, each feature disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . ", "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

As described above, according to the experimental results shown in FIG. 2, a dark current signal of the CMOS image sensor increases with the maximum electric field strength, and it can be known from further analyses that the dark current of the CMOS image sensor increases with the Vdd of the source follow transistor. The dark current of the CMOS image sensor relates to a voltage applied to the source follow transistor.

Figure 3A:
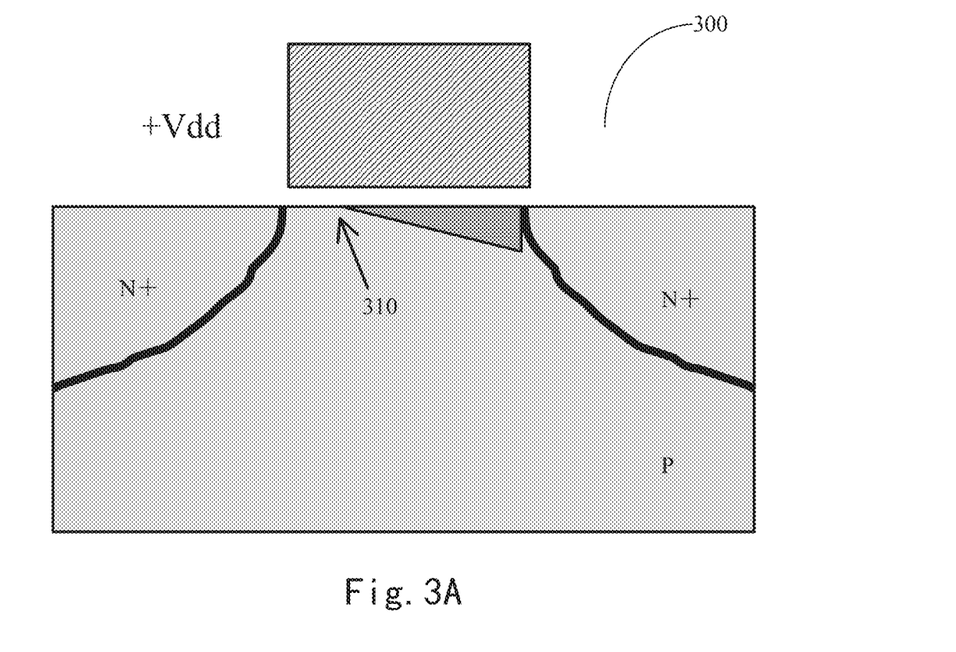
FIGS. 3A and 3B show a schematic diagram of state and a schematic diagram of emulation of the generation of thermal electrons in the source follow transistor.
Figure 3B:
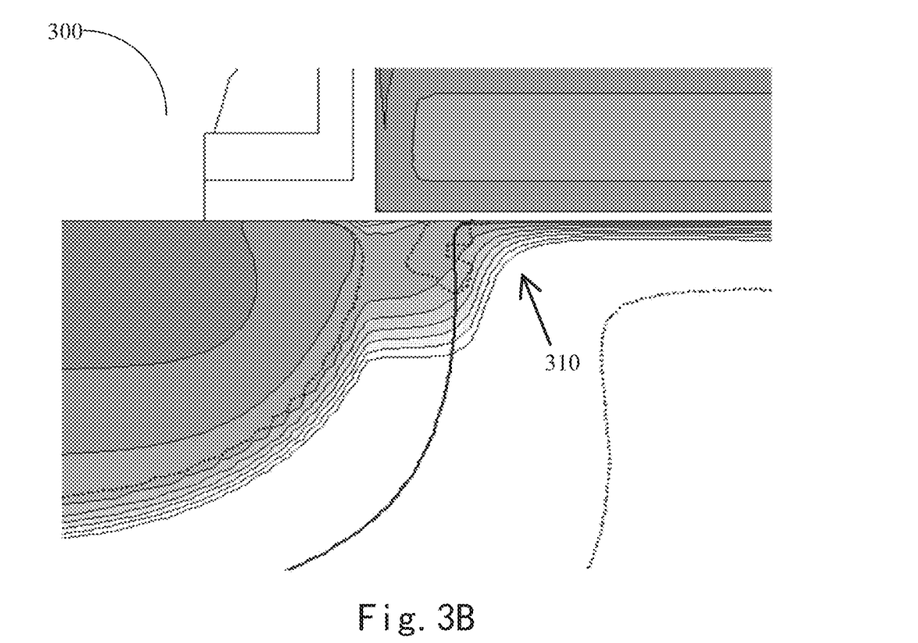

Furthermore, FIGS. 3A and 3B simulate thermal electrons generated in the source follow transistor, wherein FIG. 3A shows a schematic diagram of the application of the voltage Vdd on the source follow transistor 300 via a contact hole, and shows a pinch-off point 310; and FIG. 3B shows a schematic diagram of emulation of the generation of thermal electrons at a drain terminal of the source follow transistor 300. It can be known from FIGS. 3A and 3B in conjunction with FIG. 2 that the source which causes dark current in the CMOS image sensor is the voltage Vdd introduced via the contact hole; meanwhile, minority carriers generated by the source follower 300 from the pinch-off point 310 reduce the threshold voltage of the SF, further exacerbating the thermal electron effect. This positive feedback causes the performance of the pixel unit in the CMOS image sensor to degrade gradually as the area of the transistor reduces. Therefore, the present disclosure provides a pixel structure for reducing the effect of performance degradation of a pixel unit due to a reduction of the area of a transistor.

Figure 4A:
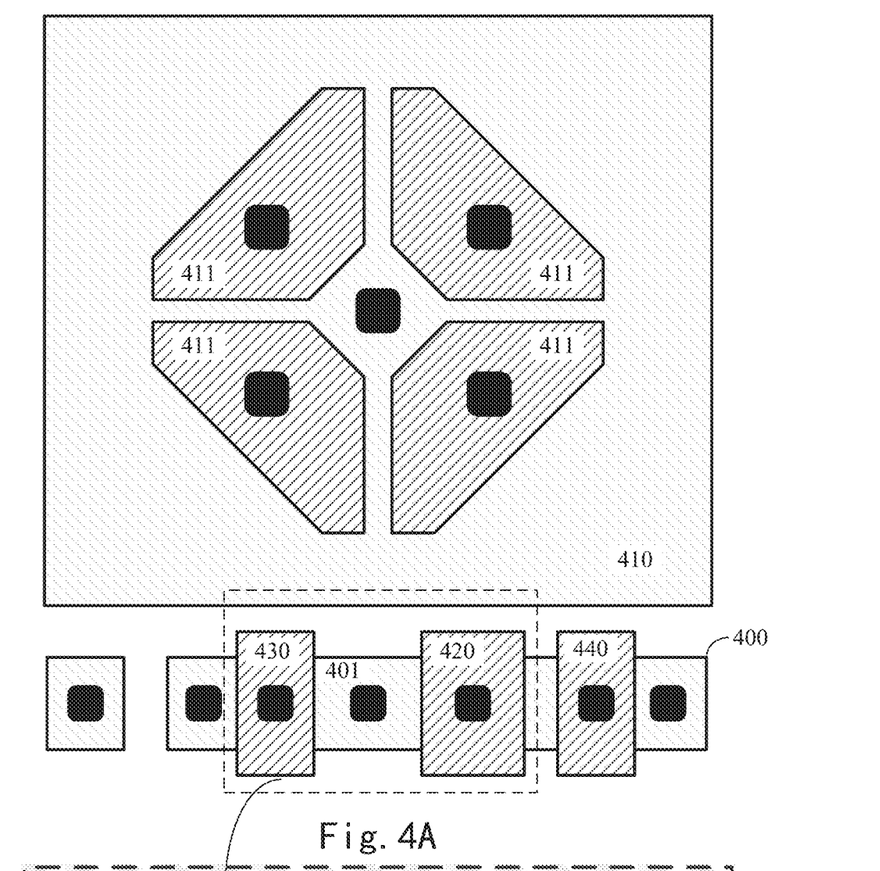
FIG. 4A shows a top planar view of a pixel unit in a CMOS image sensor in the prior art.

As regards the pixel structure provided in the present disclosure, a source follow transistor thereof has a drain terminal with reduced area, thereby increasing the distance from a drain terminal of the source follow transistor to a pixel region. In one embodiment, refer to top views of a planar structure of an existing pixel unit in a CMOS image sensor shown in FIGS. 4A and 4B. As shown in FIG. 4A, a pixel unit of a commonly used 4T-structure CMOS image sensor has a pixel region corresponding to a photo diode (PD), including a pixel region active area 410 and a pixel region gate zone 411, and a transistor active area 400 of the pixel unit, wherein a gate of source follow transistor 420, a gate of reset transistor 430, and a gate of row select transistor 440 are formed on the pixel transistor active area 400. There is a drain terminal active area 401 of the source follow transistor between the gate of source follow transistor 420 and the gate of reset transistor 430. The transistor active area 400 is separated from the pixel region active area 410 by means of an isolation strip 450. Black solid blocks in the figures are representative of contact holes in the device.

Figure 4B:
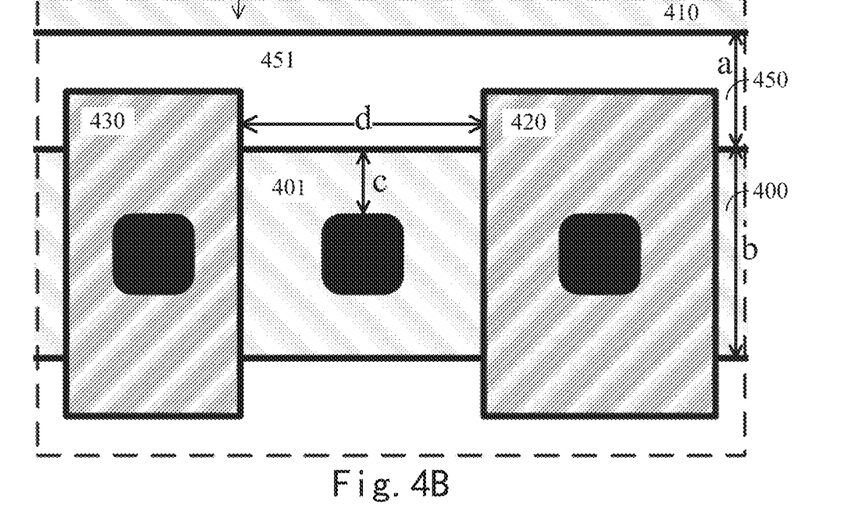
FIG. 4B enlarges a source follow transistor portion of FIG. 4A.

FIG. 4B shows the source follow transistor portion of FIG. 4A in an enlarged view. As shown in FIG. 4B, the drain terminal active area 401 of the source follow transistor of the existing pixel structure for CMOS image sensor has a width consistent with that of the transistor active area 400, the width b as shown in FIG. 4B; correspondingly, the isolation strip 451 between the drain terminal active area 401 and the pixel region active area 410 has a width consistent with that of the rest of the isolation strip 450, the width a as shown in FIG. 4B. The distance between the gate of source follow transistor 420 and the gate of reset transistor 430 is the distance d shown in FIG. 4B, and the distance from the contact hole in the drain terminal active area 401 to the boundary of the drain terminal active area 401 is c shown in FIG. 4B.

In the current semiconductor process, for a 55 nm node, the electrical characteristics of the CMOS image sensor with the 55 nm node can only be satisfied in a condition where a is required to be at least 0.1 um, b at least 0.08 um, c at least 0.015 um, and d at least 0.11 um. In an embodiment as shown in FIGS. 4A and 4B, a is 0.11 um, b is 0.22 um, c is 0.065 um, and d is 0.29 um. Although the parameter requirements of the basic electrical characteristic performance can be satisfied, for the pixel structure as shown in FIGS. 4A and 4B, the width of the drain terminal active area 401 of the source follow transistor is consistent, and is the same as that of the transistor active area 400. The conventional pixel structure cannot improve the dark current in the case where the above feature dimension is reduced.

Figure 5A:
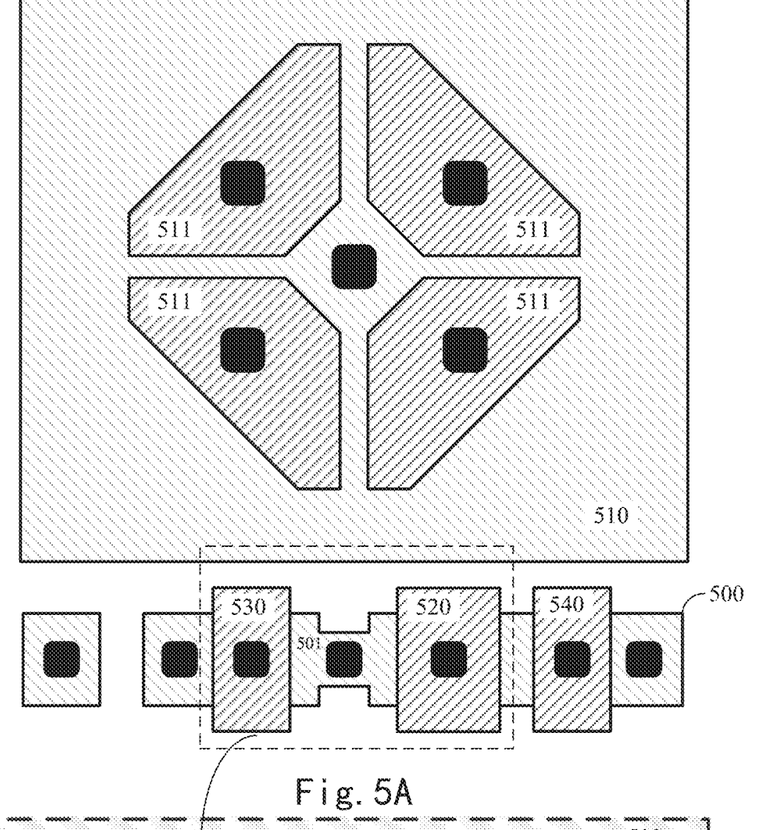
FIG. 5A shows a top planar view of an embodiment of a pixel unit in a CMOS image sensor provided in the present disclosure.
Figure 5B:
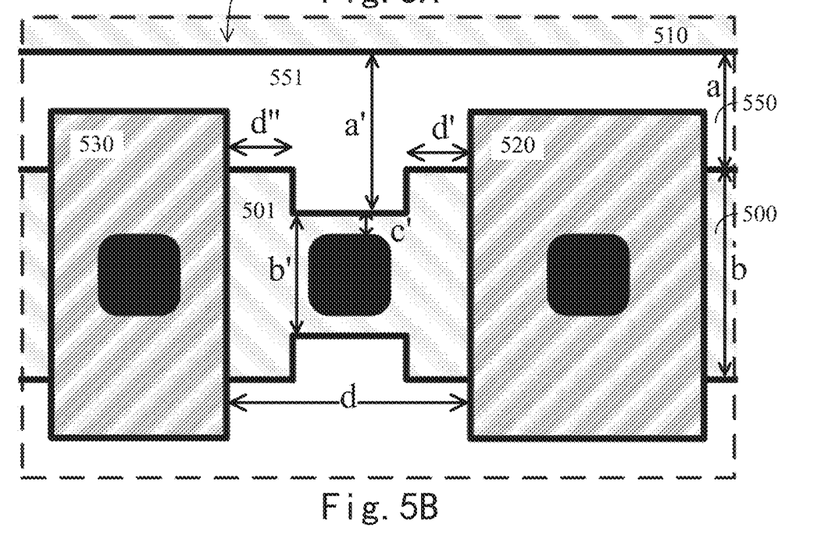
FIG. 5B enlarges a source follow transistor portion of FIG. 5A.

Top planar views of an embodiment of an improved pixel structure for CMOS image sensor provided in the present disclosure are as shown in FIGS. 5A and 5B. An embodiment of the pixel unit for CMOS image sensor provided in the present disclosure has a pixel region corresponding to a photo diode (PD), including a pixel region active area 510 and a pixel region gate zone 511, and a transistor active area 500 of the pixel unit, wherein a gate of source follow transistor 520, a gate of reset transistor 530, and a gate of row select transistor 540 are formed on the pixel transistor active area 500. There is a drain terminal active area 501 of the source follow transistor between the gate of source follow transistor 520 and the gate of reset transistor 530. The transistor active area 500 is separated from the pixel region active area 510 by means of an isolation strip 550. Black solid blocks in the figures are representative of contact holes in the device.

FIG. 5B shows the source follow transistor portion of FIG. 5A in an enlarged view. As shown in FIG. 5B, in an embodiment of the pixel structure for CMOS image sensor provided in the present disclosure, the width b' of a part, corresponding to the contact hole portion, of the drain terminal active area 501 of the source follow transistor is smaller than the width b of the rest of the drain terminal active area, and the rest of the drain terminal active area has a width b that is consistent with that of the transistor active area 500; correspondingly, the width a' of a part, corresponding to the contact hole portion, of the isolation strip 551 between the drain terminal active area 501 and the pixel region active area 510 is greater than the width a of the rest of the isolation strip, and the width a of the rest of the isolation strip 551 is consistent with the width a of the rest of the isolation strip 550. The distance between the gate of source follow transistor 520 and the gate of reset transistor 530 is d, the length of the active area having the width b between the gate of source follow transistor 520 and the gate of reset transistor 530 is the distance d'+d" shown in FIG. 5B, and the distance from the contact hole in the drain terminal active area 501 to the boundary of the drain terminal active area 501 is c' shown in FIG. 5B.

In the embodiment shown in FIGS. 5A and 5B, the drain terminal active area 501 of the source follow transistor is of an "H" shape, wherein the width b' of the part, corresponding to the contact hole portion, of the drain terminal active area is abruptly changed to be the width b of the rest of the drain terminal active area, and the width a' of the part, corresponding to the contact hole portion, of the isolation strip is abruptly changed to be the width a of the part, corresponding to of the rest of the drain terminal active area, of the isolation strip.

In the above embodiment, by reducing the area of the drain terminal active area 501 of the source follow transistor to increase the width of the isolation strip between the drain terminal active area 501 and the pixel region active area 510, a better isolation effect can be achieved. Moreover, especially for the contact hole portion where the voltage is introduced, by reducing the width of the part, corresponding to the contact hole portion, of the drain terminal active area 501, the dark current is more specifically improved from the source which generates the dark current. Furthermore, the width of the rest of the drain terminal active area 501 is enabled to be consistent with that of the transistor active area 500, so as to ensure that the length d'+d" of the rest of the drain terminal active area 501 causes an Idsat of the source follower not to degrade.

Figure 6A:
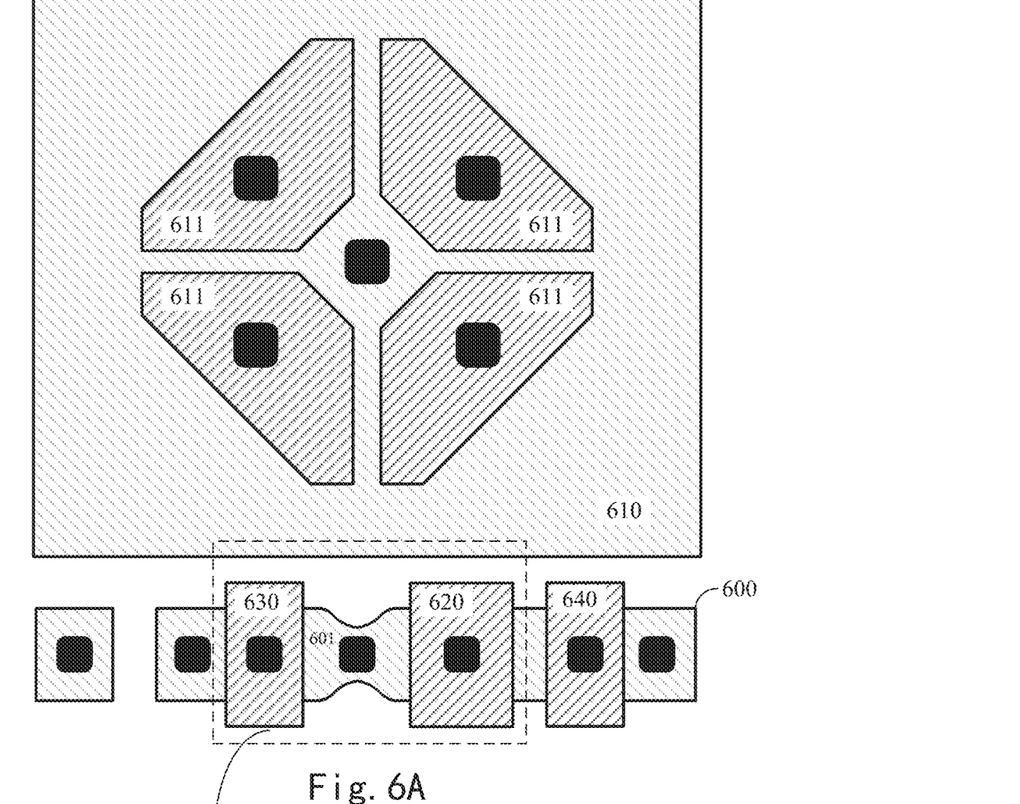
FIG. 6A shows a top planar view of another embodiment of a pixel unit in a CMOS image sensor provided in the present disclosure.
Figure 6B:
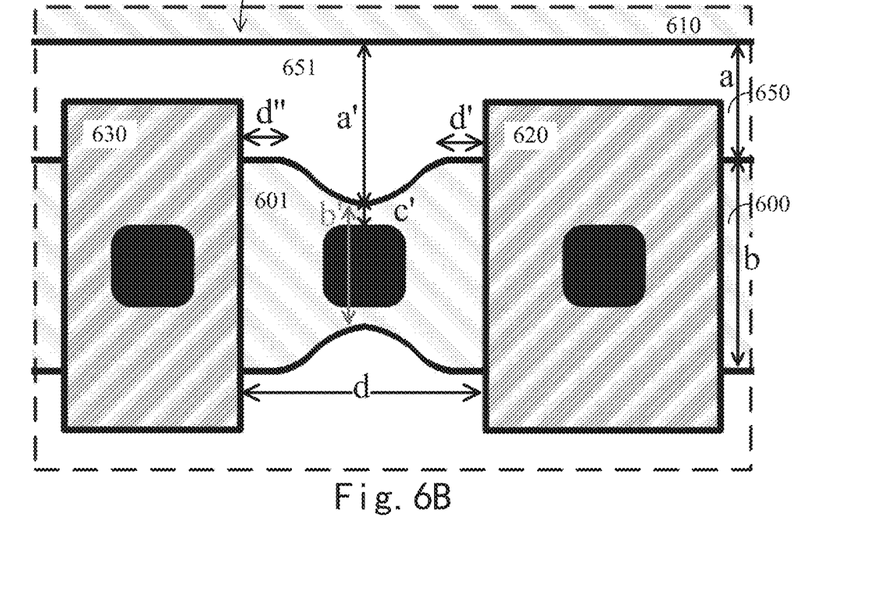
FIG. 6B enlarges a source follow transistor portion of FIG. 6A.

The present disclosure further provides a further embodiment of the improved pixel structure for CMOS image sensor, and FIGS. 6A and 6B show top planar views of the further embodiment. An embodiment of a pixel structure for CMOS image sensor provided in the present disclosure has a pixel region corresponding to a photo diode (PD), including a pixel region active area 610 and a pixel region gate zone 611, and a transistor active area 600 of the pixel unit, wherein a gate of source follow transistor 620, a gate of reset transistor 630, and a gate of row select transistor 640 are formed on the pixel transistor active area 600. There is a drain terminal active area 601 of the source follow transistor between the gate of source follow transistor 620 and the gate of reset transistor 630. The transistor active area 600 is separated from the pixel region active area 610 by means of an isolation strip 650. Black solid blocks in the figures are representative of contact holes in the device.

FIG. 6B shows the source follow transistor portion of FIG. 6A in an enlarged view. As shown in FIG. 6B, in an embodiment of the pixel structure for CMOS image sensor provided in the present disclosure, the width b' of a part, corresponding to the contact hole portion, of the drain terminal active area 601 of the source follow transistor is smaller than the width b of the rest of the drain terminal active area, and the rest of the drain terminal active area has a width b that is consistent with that of the transistor active area 600; correspondingly, the width a' of a part, corresponding to the contact hole portion, of the isolation strip 651 between the drain terminal active area 601 and the pixel region active area 610 is greater than the width a of the rest of the isolation strip, and the width a of the rest of the isolation strip 651 is consistent with the width a of the rest of the isolation strip 650. The distance between the gate of source follow transistor 620 and the gate of reset transistor 630 is d, the length of the active area having the width b between the gate of source follow transistor 620 and the gate of reset transistor 630 is the distance d'+d" shown in FIG. 6B, and the distance from the contact hole in the drain terminal active area 601 to the boundary of the drain terminal active area 601 is c shown in FIG. 6B.

In the embodiment shown in FIGS. 6A and 6B, the drain terminal active area 601 of the source follow transistor is of an "hourglass" shape, wherein the width b' of the part, corresponding to the contact hole portion, of the drain terminal active area smoothly transits to the width b of the rest of the drain terminal active area, and the width a' of the part, corresponding to the contact hole portion, of the isolation strip smoothly transits to the width a of the part, corresponding to the rest of the drain terminal active area, of the isolation strip.

In the above embodiment, by reducing the area of the drain terminal active area 601 of the source follow transistor to increase the width of the isolation strip between the drain terminal active area 601 and the pixel region active area 610, a better isolation effect can be achieved. Moreover, especially for the contact hole portion where the voltage is introduced, by reducing the width of the part, corresponding to the contact hole portion, of the drain terminal active area 601, the dark current is more specifically improved from the source which generates the dark current. Furthermore, the width of the rest of the drain terminal active area 601 is enabled to be consistent with that of the transistor active area 600, so as to ensure that the length d'+d" of the rest of the drain terminal active area 601 causes an Idsat of the source follower not to degrade.

In the embodiment of the improved pixel structure for CMOS image sensor provided in the present disclosure described above, the mentioned dimension parameters and descriptions are displayed using the following table, so as to highlight the difference between the existing structure and the structure provided in the present disclosure.

| Serial Number | Description of Serial Number | Prior art (um) | Improved structure (um) | Parameter description |
|---|---|---|---|---|
| a | Distance between the transistor active area and the pixel region active area | 0.11 | 0.11; 0.13-0.16 (a') | Satisfy 55 nm requirements (0.11 um) |

-continued

| Serial Number | Description of Serial Number | Prior art (um) | Improved structure (um) | Parameter description |
|---|---|---|---|---|
| b | The width of the transistor region active area | 0.22 | 0.22; 0.12-0.18 (b') | Satisfy 55 nm requirements (0.08 um) |
| c | The distance from the contact hole in the drain region of the source follow transistor to the boundary of the active area | 0.065 | 0.015-0.045 (c') | Satisfy 55 nm requirements (0.015 um) |
| d | The distance between the gate of reset transistor and the gate of source follow transistor | 0.29 | 0.29 (d); 0.1 (d', d") | Satisfy 55 nm requirements (0.11 um) where d' and d" can ensure that the Idsat of the source follow transistor does not degrade |

In the above table, in the embodiment of the improved pixel structure for CMOS image sensor provided in the present disclosure described above, the width b' of the part, corresponding to the contact hole portion, of the drain terminal active area is in a range of 0.12-0.18 um, the width b of the rest of the drain terminal active area is consistent with that of the transistor active area, which is 0.22 um. Furthermore, design of the value of b to be in the range of 0.16-0.24 um as needed, rather than being limited to 0.22 um, and the above parameters meet the 55 nm node process requirements. The width a' of the part, corresponding to the contact hole portion, of the isolation strip between the drain terminal active area and the pixel region active area is in a range of 0.13-0.16 um, and the width a of the rest of the isolation strip between the drain terminal active area and the pixel region active area is consistent with that of the rest of the isolation strip, which is 0.11 um. Furthermore, design of the value of a to be in the range of 0.11-0.14 um as needed, rather than being limited to 0.11 um, and the above parameters meet the 55 nm node process requirement. The range of the distance c' from the contact hole in the drain terminal active area to the boundary of the drain terminal active area is 0.015-0.045 um, each of the lengths d' and d" of the active area having the width b between the gate of source follow transistor and the gate of reset transistor is 0.1 um, respectively, and d'+d" is 0.2 um, and the distance d between the gate of source follow transistor and the gate of reset transistor is 0.29. Furthermore, design of the value of d to be in the range of 0.2-0.4 um as needed, rather than being limited to 0.29 um, and the above parameters meet the 55 nm node process requirement and can be achieved by the existing process to enable the CMOS image sensor to have a superior performance.

Therefore, the improved pixel structure for CMOS image sensor provided in the present disclosure can satisfy the parameter requirements of the basic electrical characteristic performance of the 55 nm node.

The isolation strip mentioned in the pixel structure provided in the present disclosure may be a shallow trench isolation, and the isolation strip may also be other media which is formed in the existing or further process and functions as electrically isolation between devices, rather than being limited to the shallow trench isolation.

Although the pixel structure provided in the present disclosure is described by taking the 4T-structure CMOS image sensor as an example in the above detailed description, disclosure the area of the drain terminal active area of the source follow transistor is reduced, in particular, the width of the part, corresponding to the contact hole portion, of the drain terminal active area is reduced, and which are applied to reduce the dark current resulted from the drain terminal of the source follow transistor can still be applied to CMOS image sensors having other structures, and in particular, can be applied to a CMOS image sensor including a source follow transistor, rather than being limited to the 4T-structure CMOS image sensor.

In one embodiment, the pixel structure and the CMOS image sensor provided in the present disclosure may further comprise other structures or devices for implementing the function of the pixel structure in the CMOS image sensor, which will not be described in detail in the detailed description So far, the embodiments of the pixel structure provided in the present disclosure which can reduce the dark current of the CMOS image sensor have been described. The present disclosure further provides a CMOS image sensor including the above pixel structure that can be improved. The pixel structure and the CMOS image sensor provided in the present disclosure can be improved in terms of a source which generates thermal electrons as well as a transfer process, thereby effectively reducing the amount of the generated thermal electrons, and blocking the transfer process, and can effectively reduce the dark current of the pixel region unit, and is fully compatible with the prior art and can satisfy the requirements of mass production.

The present disclosure further provides a manufacturing method for manufacturing the above pixel structure, comprising: providing a substrate; forming an isolation strip in the substrate to define an active area of a photo diode and an active area of a source follow transistor of the pixel structure separated by the isolation strip, wherein the width of a part, corresponding to a contact hole portion in a drain terminal active area of the source follow transistor, of the isolation strip is greater than the width of a part, corresponding to the rest of the drain terminal active area of the source follow transistor, of the isolation strip, so that the width of a part, corresponding to the contact hole portion, of the drain terminal active area of the source follow transistor is smaller than the width of the rest of the drain terminal active area of the source follow transistor.

The substrate can be a semiconductor wafer such as a silicon wafer or a silicon epitaxial layer on the wafer. Alternatively or additionally, the substrate may include an elemental semiconductor material, a compound semiconductor material, and/or an alloy semiconductor material. Examples of elemental semiconductor materials may be, but are not limited to, crystalline silicon, polycrystalline silicon, amorphous silicon, germanium, and/or diamond. Examples of compound semiconductor materials may be, but not limited to, silicon carbide, gallium arsenide, gallium phosphide, indium phosphide, indium arsenide, and/or indium antimonide. Examples of alloy semiconductor materials may be, but not limited to, SiGe, GaAsP, AlInAs, AlGaAs, GaInAs, GaInP, and/or GaInAsP.

In the process of forming the isolation strip, the isolation strip is defined so that the drain terminal active area of the source follow transistor is of an hourglass shape, so that the width of the part, corresponding to the contact hole portion, of the drain terminal active area smoothly transits to the width of the rest of the drain terminal active area, and the width of the part, corresponding to the contact hole portion, of the isolation strip smoothly transits to the width of the part, corresponding to the drain terminal active area, of the rest of the isolation strip.

In another embodiment, in the process of forming the isolation strip, the isolation strip is defined so that the drain terminal active area of the source follow transistor is of an H-shape, so that the width of the part, corresponding to the contact hole portion, of the drain terminal active area is abruptly changed to be the width of the rest of the drain terminal active area, and the width of the part, corresponding to the contact hole portion, of the isolation strip is abruptly changed to be the width of the part, corresponding to the rest of the drain terminal active area, of the isolation strip.

In an embodiment, the isolation strip is formed by means of a shallow trench isolation process (STI), wherein the shallow trench isolation (STI) process includes, but is not limited to, shallow trench etching, oxide filling, and oxide planarization. Among these, the shallow trench etching includes but is not limited to isolating an oxide layer, depositing a nitride, performing shallow trench isolation with a mask and performing STI shallow trench etching. Among these, the STI oxide fill includes but is not limited to trench liner silicon oxide, trench CVD (chemical vapour deposition) oxide fill or PVD (physical vapour deposition) oxide fill. Among these, the planarization of the silicon surface can be implemented by means of various methods. The planarization of the silicon wafer can be implemented by using SOG (spin-on-glass) filling gaps, wherein the SOG can be formed of 80% solvent and 20% silicon dioxide, and after the deposition, the SOG is baked, the solvent is evaporated off, and the silicon dioxide is remained in the gaps, and it is also possible to conduct back etching of the entire surface to reduce the thickness of the entire wafer. The planarization treatment can also be effectively performed through a CMP process (also referred to as a polishing process) including, but not limited to, polishing a trench oxide (chemical mechanical polishing can be used) and removing nitride.

In one embodiment, the above process of forming the isolation strip may also be formed by means of other existing or further isolation processes, rather than being limited to be formed by means of the shallow trench isolation process.

After forming the isolation strip to define an active area of the photo diode and an active area of the source follow transistor separated by the isolation strip, the manufacturing method further comprises forming the photo diode and the source follow transistor of the CMOS image sensor in the active areas respectively. The above photo diode and source follow transistor forming the CMOS photosensor can be formed by means of the existing or further techniques, and will not be described herein. Moreover, the manufacturing method for the pixel structure provided in the present disclosure may further comprise a method or a step of manufacturing other structures or devices for implementing the function of the pixel structure in the CMOS image sensor, which will not be described in detail in the detailed description.

The pixel structure manufactured according to the manufacturing method provided in the present disclosure can be improved in terms of a source which generates thermal electrons as well as a transfer process, thereby effectively reducing the amount of the generated thermal electrons, and blocking the transfer process, and can effectively reduce the dark current of the pixel region unit, and the provided manufacturing method is fully compatible with the prior art and can satisfy the requirements of mass production.

Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A pixel structure for a CMOS image sensor, comprising:
   a photo diode and a source follow transistor, wherein an isolation strip is provided between the photo diode and the source follow transistor, and a contact hole is provided in a drain terminal of the source follow transistor, with the width of a part, corresponding to the contact hole portion, of a drain terminal active area of the source follow transistor being smaller than the width of the rest of the drain terminal active area, so that the width of a part, corresponding to the contact hole portion, of the isolation strip is greater than the width of a part, corresponding to the rest of the drain terminal active area, of the isolation strip.

2. The pixel structure of claim 1, wherein the drain terminal active area is of an hourglass shape.

3. The pixel structure of claim 1, wherein the drain terminal active area is of an H-shape.

4. The pixel structure of claim 1, wherein the width of the part, corresponding to the contact hole portion, of the drain terminal active area is in a range of 0.12-0.18 um, and the width of the rest of the drain terminal active area is in a range of 0.16-0.24 um.

5. The pixel structure of claim 4, wherein the width of the rest of the drain terminal active area is 0.22 um.

6. The pixel structure of claim 1, wherein the width of the part, corresponding to the contact hole portion, of the isolation strip is in a range of 0.13-0.16 um, and the width of the part, corresponding to the rest of the drain terminal active area, of the isolation strip is in a range of 0.11-0.14 um.

7. The pixel structure of claim 6, wherein the width of the part, corresponding to the rest of the drain terminal active area, of the isolation strip is 0.11 um.

8. The pixel structure of claim 1, wherein the distance between the contact hole and the boundary of the drain terminal active area is in a range of 0.015-0.045 um.

9. The pixel structure of claim 1, further comprising a reset transistor, wherein the drain terminal active area is between the gate of the reset transistor and the gate of the source follow transistor, and the length of the rest of the drain terminal active area is in a range of 0.2-0.4 um.

10. The pixel structure of claim 9, wherein the length of the rest of the drain terminal active area is 0.2 um.

11. The pixel structure of claim 9, further comprising a row select transistor and a transfer transistor, wherein the width of a device active area of each of the reset transistor, the row select transistor, and the transfer transistor is consistent with the width of the rest of the drain terminal active area.

12. The pixel structure of claim 1, wherein the isolation strip comprises a shallow trench isolation.

13. A CMOS image sensor comprising:
a pixel structure for a CMOS image sensor, comprising:
a photo diode and a source follow transistor, wherein an isolation strip is provided between the photo diode and the source follow transistor, and a contact hole is provided in a drain terminal of the source follow transistor, with the width of a part, corresponding to the contact hole portion, of a drain terminal active area of the source follow transistor being smaller than the width of the rest of the drain terminal active area, so that the width of a part, corresponding to the contact hole portion, of the isolation strip is greater than the width of a part, corresponding to the rest of the drain terminal active area, of the isolation strip.

14. A manufacturing method for a pixel structure, wherein the pixel structure is used for a CMOS image sensor, the manufacturing method comprising:
providing a substrate;
forming an isolation strip in the substrate to define an active area of a photo diode and an active area of a source follow transistor of the pixel structure separated by the isolation strip; and
forming the photo diode and the source follow transistor on the active areas, wherein
the width of a part, corresponding to a contact hole portion in a drain terminal active area of the source follow transistor, of the isolation strip is greater than the width of a part, corresponding to the rest of the drain terminal active area of the source follow transistor, of the isolation strip, so that the width of a part, corresponding to the contact hole portion, of the drain terminal active area of the source follow transistor is smaller than the width of the rest of the drain terminal active area of the source follow transistor.

15. The manufacturing method of claim 14, wherein the isolation strip is formed to define the drain terminal active area of the source follow transistor to be of an hourglass shape.

16. The manufacturing method of claim 14, wherein the isolation strip is formed to define the drain terminal active area of the source follow transistor to be of an H-shape.

17. The manufacturing method of claim 14, wherein the isolation strip is formed by means of a shallow trench isolation process.

* * * * *